United States Patent
Sunachi et al.

(10) Patent No.: US 10,510,557 B2
(45) Date of Patent: Dec. 17, 2019

(54) ELECTRONIC PART MOUNTING SUBSTRATE AND METHOD FOR PRODUCING SAME

(71) Applicant: DOWA METALTECH CO., LTD., Tokyo (JP)

(72) Inventors: Naoya Sunachi, Akita (JP); Hideyo Osanai, Nagano (JP); Satoru Kurita, Okayama (JP)

(73) Assignee: DOWA METALTECH CO., LTD., Tokyo (JP)

( * ) Notice: Subject to any disclaimer, the term of this patent is extended or adjusted under 35 U.S.C. 154(b) by 0 days.

(21) Appl. No.: 14/087,117

(22) Filed: Nov. 22, 2013

(65) Prior Publication Data

US 2014/0147695 A1    May 29, 2014

(30) Foreign Application Priority Data

Nov. 28, 2012  (JP) ................... 2012-259329
Mar. 28, 2013  (JP) ................... 2013-068775

(51) Int. Cl.
*B23K 35/22* (2006.01)
*H01L 21/48* (2006.01)
*B23K 35/00* (2006.01)

(52) U.S. Cl.
CPC ........ *H01L 21/4857* (2013.01); *B23K 35/001* (2013.01); *B23K 35/22* (2013.01); *Y10T 428/12472* (2015.01)

(58) Field of Classification Search
CPC ............. B23K 2201/40; H01L 2924/01047
See application file for complete search history.

(56) References Cited

U.S. PATENT DOCUMENTS 6,404,065 B1 *  6/2002  Choi .................. H01L 23/3121
                                                      257/675
6,798,060 B2 *  9/2004  Strauch ............... H01L 23/3735
                                                      257/691

(Continued)

FOREIGN PATENT DOCUMENTS

JP         06296920       10/1994
JP      2009117435 A       5/2009
JP      2011080147 A       4/2011

OTHER PUBLICATIONS

Manikam et al., "Die Attach Materials for High Temperature Applications", IEEE Transactions, Apr. 2011, vol. 1, No. 4, p. 457-478.*

(Continued)

*Primary Examiner* — Devang R Patel
(74) *Attorney, Agent, or Firm* — Bachman & LaPointe, PC

(57) ABSTRACT

An electronic part mounting substrate includes: a metal plate 10 (for mounting thereon electronic parts) of aluminum or an aluminum alloy having a substantially rectangular planar shape, one major surface of the metal plate 10 being surface-processed so as to have a surface roughness of not less than 0.2 micrometers; a plating film 20 of nickel or a nickel alloy formed on the one major surface of the metal plate 10; an electronic part 14 bonded to the plating film 20 by a silver bonding layer 12 (containing a sintered body of silver); a ceramic substrate 16 having a substantially rectangular planar shape, one major surface of the ceramic substrate 16 being bonded to the other major surface of the metal plate 10; and a radiating metal plate (metal base plate) 18 bonded to the other major surface of the ceramic substrate 16.

13 Claims, 1 Drawing Sheet

(56) References Cited

U.S. PATENT DOCUMENTS

| | | | |
|---|---|---|---|
| 7,005,734 B2* | 2/2006 | Choi | H01L 23/3735 257/686 |
| 8,257,795 B2* | 9/2012 | Lu et al. | 427/383.3 |
| 2004/0245648 A1* | 12/2004 | Nagasawa et al. | 257/772 |
| 2006/0049519 A1 | 3/2006 | Otsuki | |
| 2009/0140410 A1* | 6/2009 | Higashi | G01D 5/2417 257/690 |
| 2009/0243089 A1 | 10/2009 | Hohlfeld et al. | |
| 2009/0294963 A1* | 12/2009 | Guth et al. | 257/741 |
| 2010/0055839 A1 | 3/2010 | Nikitin | |
| 2012/0014069 A1* | 1/2012 | Zeng et al. | 361/718 |
| 2012/0114927 A1* | 5/2012 | Khaselev et al. | 428/220 |
| 2012/0224335 A1 | 9/2012 | Yuan et al. | |
| 2012/0291454 A1* | 11/2012 | Kahler | F25B 21/02 62/3.7 |
| 2012/0292009 A1* | 11/2012 | Kahler | H01L 24/75 166/65.1 |
| 2013/0328204 A1* | 12/2013 | Zommer | 257/765 |

OTHER PUBLICATIONS

Fox et al.. "Sintered Silver Joint Strength Dependence on Substrate Topography", CIPC—Nuremberg, Germany, Mar. 2012, p. 1-6.*

Schmitt W et al., "Sinter materials for broad process windows in DCB packages—concepts and results", Integrated Power Electronics Systems (CIPS), 7th International Conference on Mar. 6-8, 2012, Nuremberg, Germany, VDE Verlag GmbH, pp. 1-6, XP032181465.

European Search Report for Application No. 13194544.6 dated Sep. 30, 2014.

Lu, Guo-Quan et al., A Lead-Free, Low-Temperature Sintering Die-Attach Technique for High-Performance and High-Temperature Packaging, Proceeding of the Sixth IEEE CPMT Conference on High Density Microsystem Design and Packaging and Component Failure Analysis , 2004 (HDP '04), Shanghai, China, Jun. 30, 2004-Jul. 3, 2004, Piscataway, NJ, USA, IEEE, US, Jun. 30, 2004, pp. 42-46, XP010733589.

Chapter 2: Niedertemperatur-Verbindungstechnik in: Klaka S: "Eine Niedertemperatur-Verbindungstechnik Zum Afubau Von Leistungshalbleitermodulen", 1997, Cuvillier Verlag, Gottingen, Germany, XP001526262, ISBN: 3-89588-771-4, pp. 5-8.

Chapter 3: Der Verbindungsmechanismus, in: Klaka S: "Eine Niedertemperatur-Verbindungstechnik Zum Aufbau Von Leistungshalbleitermodulen", 1997, Cuvillier Verlag, Gottingen, Germany, XP001526263, ISBN: 3-89588-771-4, pp. 9-41.

European Search Report for Application No. 13194544.6, dated Jun. 30, 2014.

* cited by examiner

ELECTRONIC PART MOUNTING SUBSTRATE AND METHOD FOR PRODUCING SAME

BACKGROUND OF THE INVENTION

Field of the Invention

The present invention generally relates to an electronic part mounting substrate and a method for producing the same. More specifically, the invention relates to an electronic part mounting substrate wherein at least one electronic part, such as a semiconductor chip, is mounted on one side of a metal plate of aluminum or an aluminum alloy of a metal/ceramic bonding substrate wherein the other side of the metal plate is bonded to a ceramic substrate, and a method for producing the same.

Description of the Prior Art

Power modules have been used for controlling heavy-current for electric vehicles, electric railcars, machine tools and so forth. In a conventional power module, a metal/ceramic insulating substrate is fixed to one side of a metal plate or compound material called base plate, and semiconductor chips are fixed to a metal circuit plate of the metal/ceramic insulating substrate by soldering.

In recent years, it is proposed that a silver paste containing fine silver particles is used as a bonding agent to be arranged between articles to be heated for a predetermined period of time while pressing the articles against each other, to sinter silver in the bonding agent to bond the articles to each other (see, e.g., Japanese Patent Laid-Open No. 2011-80147). It is attempted that such a bonding agent is substituted for solder to fix electronic parts, such as semiconductor chips, on a metal plate of a metal/ceramic insulating substrate.

However, if the silver paste containing fine silver particles disclosed in Japanese Patent Laid-Open No. 2011-80147 is used as a bonding agent, it is not possible to obtain a sufficient bonding strength unless articles to be bonded are made of copper or plated with an expensive noble metal, such as gold, silver or palladium. For that reason, in the case of a metal/ceramic insulating substrate wherein a metal plate of aluminum or an aluminum alloy (for mounting thereon electronic parts) is bonded to a ceramic substrate, or in the case of a metal/ceramic insulating substrate wherein a metal plate of aluminum or an aluminum alloy (for mounting thereon electronic parts) is plated with nickel or a nickel alloy to be bonded to a ceramic substrate, it is not possible to use the silver paste containing fine silver particles, which is disclosed in Japanese Patent Laid-Open No. 2011-80147, as a bonding agent to bond electronic parts, such as semiconductor chips, to the metal plate (mounting thereon electronic parts) with a sufficient bonding strength.

SUMMARY OF THE INVENTION

It is therefore an object of the present invention to eliminate the aforementioned problems and to provide an electronic part mounting substrate capable of bonding an electronic part to a metal plate of aluminum or an aluminum alloy with a sufficient bonding strength, and a method for producing the same.

In order to accomplish the aforementioned and other objects, the inventors have diligently studied and found that it is possible to bond an electronic part to a metal plate of aluminum or an aluminum alloy with a sufficient bonding strength, if the electronic part is bonded to one side of the metal plate with a silver bonding layer formed by sintering silver in a silver paste, which is applied on the one side of the metal plate and on which the electronic part is applied, after the one side of the metal plate is surface-machined so as to have a surface roughness of not less than 0.2 micrometers. Thus, the inventors have made the present invention.

According one aspect of the present invention, there is provided a method for producing an electronic part mounting substrate wherein an electronic part is mounted on one side of a metal plate of aluminum or an aluminum alloy, the method comprising the steps of: surface-machining the one side of the metal plate so as to cause the surface roughness thereof to be 0.2 micrometers or more; applying a silver paste on the surface-machined side of the metal plate; arranging the electronic part on the silver paste applied on the surface-machined side of the metal plate; and sintering silver in the silver paste to form a silver bonding layer to bond the electronic part to the surface-machined side of the metal plate with the silver bonding layer.

In this method for producing an electronic part mounting substrate, the sintering is preferably carried out by heating the silver paste while pressing the electronic part against the metal plate. The surface-machined side of the metal plate is preferably plated with nickel or a nickel alloy before the silver paste is applied after the surface-machining is carried out. The surface-machining is preferably an abrasive blasting or a lapping machining. The surface of the electronic part to be bonded to the surface-machined side of the metal plate is preferably covered with a metal capable of being bonded with the silver paste. In this case, the metal capable of being bonded with the silver paste is preferably at least one metal, which is selected from the group consisting of gold, silver, copper and palladium, or an alloy thereof. The surface of the electronic part to be bonded to the surface-machined side of the metal plate may be plated with at least one metal, which is selected from the group consisting of gold, silver and palladium, or an alloy thereof. One side of a ceramic substrate is preferably bonded to the other side of the metal plate. In this case, a metal base plate is preferably bonded to the other side of the ceramic substrate.

According to another aspect of the present invention, there is provided an electronic part mounting substrate comprising: a metal plate of aluminum or an aluminum alloy, one side of the metal plate having a surface roughness of not less than 0.2 micrometers; a silver bonding layer formed on the one side of the metal plate; and an electronic part bonded to the one side of the metal plate with the silver bonding layer.

In this electronic part mounting substrate, a plating film of nickel or a nickel alloy is preferably formed on the one side of the metal plate, and the electronic part is preferably bonded to the one side of the metal plate via the plating film with the silver bonding layer. In this case, the plating film preferably has a surface roughness of not less than 0.4 micrometers. The surface of the electronic part to be bonded to the one side of the metal plate is preferably covered with a metal capable of being bonded with the silver bonding layer. In this case, the metal capable of being bonded with the silver bonding layer is preferably at least one metal, which is selected from the group consisting of gold, silver, copper and palladium, or an alloy thereof. The surface of the electronic part to be bonded to the one side of the metal plate may be plated with at least one metal, which is selected from the group consisting of gold, silver and palladium, or an alloy thereof. The silver bonding layer preferably contains a sintered body of silver. One side of a ceramic substrate is preferably bonded to the other side of the metal plate. In this case, a metal base plate is preferably bonded to the other side of the ceramic substrate.

According to the present invention, it is possible to bond an electronic part to a metal plate of aluminum or an aluminum alloy with a sufficient bonding strength in a method for producing an electronic part mounting substrate wherein the electronic part is mounted on one side of the metal plate.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DESCRIPTION OF THE PREFERRED EMBODIMENTS

Referring now to the accompanying drawings, the preferred embodiment of an electronic part mounting substrate and a method for producing the same according to the present invention will be described below.

Figure 1:
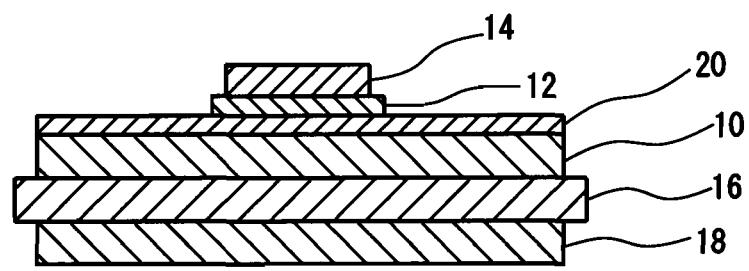
FIG. 1 is a sectional view schematically showing a preferred embodiment of an electronic part mounting substrate according to the present invention.
Figure 2:
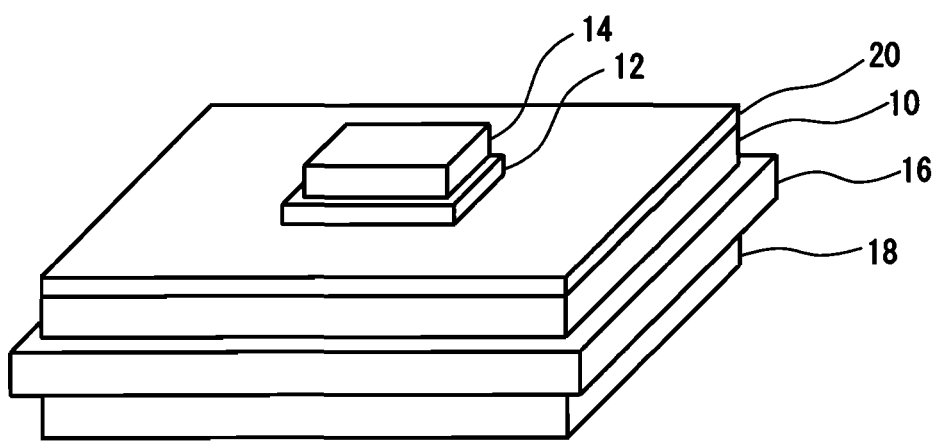
FIG. 2 is a perspective view of the electronic part mounting substrate of FIG. 1.

As shown in FIGS. 1 and 2, in the preferred embodiment of an electronic part mounting substrate, an electronic part 14 is bonded to one major surface of a metal plate 10 (for mounting thereon electronic parts), which has a substantially rectangular planar shape, with a silver bonding layer 12 (containing a sintered body of silver). On the other major surface of the metal plate 10, one major surface of a ceramic substrate 16 having a substantially rectangular planar shape may be bonded. On the other major surface of the ceramic substrate 16, a radiating metal plate (metal base plate) 18 having a substantially rectangular planar shape may be bonded. The one major surface of the metal plate 10 may be plated with nickel or a nickel alloy to form a plating film 20 of nickel or the nickel alloy thereon, and the electronic part 14 may be bonded thereon with the silver bonding layer 12.

Furthermore, the metal plate 10 is made of aluminum or an aluminum alloy. The one major surface (the surface to which the electronic part is to be bonded) of the metal plate 10 has a surface roughness of not less than 0.2 μm, preferably in the range of from 0.3 μm to 2.0 μm. When the plating film 20 of nickel or an nickel alloy is formed, if the surface roughness of the plating film 20 is less than 0.4 μm, it is difficult to bond the electronic part 14 thereto with the silver bonding layer 12. For that reason, the surface roughness of the plating film 20 is preferably not less than 0.4 μm, and more preferably in the range of from 0.5 μm to 2.0 μm.

The surface of the electronic part 14 to be bonded to the one major surface of the metal plate 10 is preferably covered with a metal, which is capable of being bonded with the silver bonding layer 12, such as at least one metal selected from the group consisting of gold, silver, copper and palladium, or an alloy thereof, and is preferably plated with at least one metal selected from the group consisting of gold, silver and palladium, or an alloy thereof.

In the preferred embodiment of a method for producing an electronic part mounting substrate according to the present invention, there is produced an electronic part mounting substrate wherein the electronic part 14 is mounted on the one major surface of the metal plate 10 of aluminum or the aluminum alloy. In this method, the one major surface of the metal plate 10 is machined so as to have a surface roughness of not less than 0.2 μm, preferably in the range of from 0.3 μm to 2.0 μm. After a silver paste is applied on the machined major surface to arrange the electronic part 14 thereon, silver in the silver paste is sintered to form the silver bonding layer 12 to bond the electronic part 14 to the one major surface of the metal plate 10 with the silver bonding layer 12.

Furthermore, the sintering of silver in the silver paste is preferably carried out by heating while pressing the electronic part 14 against the metal plate 10. The heating temperature during the sintering is preferably in the range of from 200° C. to 400° C., and more preferably in the range of from 220° C. to 300° C. The heating time during the sintering is preferably in the range of from 1 minute to 10 minutes. The pressure applied during the sintering may be 10 MPa or less, preferably in the range of from 2 MPa to 10 MPa, and more preferably in the range of from 3 MPa to 8 MPa.

On the other major surface of the metal plate 10, the one major surface of the ceramic substrate 16 having a substantially rectangular planar shape may be bonded, and on the other major surface of the ceramic substrate 16, the radiating metal plate (metal base plate) 18 having a substantially rectangular planar shape may be bonded. In this case, after the bonding between the metal plate 10 and the ceramic substrate 16 and the bonding between the ceramic substrate 16 and the meal base plate 18 are carried out, the one major surface (the surface to which the electronic part 14 is to be bonded) of the metal plate 10 may be machined to apply the silver paste thereon to arrange the electronic part 14 thereon, and then, silver in the silver paste may be sintered to form the silver bonding layer 12 to bond the electronic part 14 to the one major surface of the metal plate 10 with the silver bonding layer 12. The bonding between the metal plate 10 and the ceramic substrate 16 and the bonding between the ceramic substrate 16 and the metal base plate 18 are preferably carried out by a method comprising the steps of: arranging the ceramic substrate 16 in a mold (not shown); injecting a molten metal of aluminum or an aluminum alloy into the mold so that the molten metal contacts both major surfaces of the arranged ceramic substrate 16; and cooling and solidifying the injected molten metal to form the metal plate 10 and the metal base plate 18 on the major surfaces of the ceramic substrate 16, respectively, to bond them directly to the ceramic substrate 16.

After the one major surface of the metal plate 10 is machined and before the silver paste is applied thereon, the one major surface of the metal plate 10 may be plated to form the plating film 20 of nickel or a nickel alloy having a thickness of 0.1 to 10 μm, preferably 0.5 to 6 μm. If such a plating film 20 is formed, the surface roughness of the plating film 20 may be preferably 0.4 μm or more, and more preferably in the range of from 0.5 μm to 2.0 μm.

The surface machining is preferably carried out by an abrasive blasting (such as a wet blasting for spraying an abrasive slurry, which contains fine particles in a liquid, onto the surface of a metal plate) or a lapping machining (for sliding and lapping a metal plate, which is arranged on a lapping machine via a lapping agent serving as abrasive grains, while pressing the metal plate thereon).

The silver paste may be a paste containing fine silver particles capable of being sintered at a temperature of not higher than 400° C., and is preferably a bonding agent (e.g., PA-HT-1503M-C commercially available from Dowa Electronics Materials Co., Ltd.) wherein fine silver particles having an average primary particle diameter of 1 to 200 nm coated with an organic compound having 8 or less (preferably 6 to 8) of carbon atoms are dispersed in a dispersing medium (preferably a polar dispersing medium). The silver paste may be a bonding agent (e.g., PA-HT-1001L commercially available from Dowa Electronics Materials Co., Ltd.) wherein silver particles having an average primary particle diameter ($D_{50}$ diameter) of 0.5 to 3.0 μm are dispersed in the dispersing agent in which the fine silver particles are dispersed.

In the preferred embodiment of a method for producing an electronic part mounting substrate according to the present invention, if the silver paste is heated at a low temperature of about 250 to 260° C. while being pressed at a low pressure of about 5 to 7 MPa when silver in the silver paste is sintered, it is possible to bond the electronic part to the metal plate of aluminum or the aluminum alloy with a sufficient bonding strength (without forming any bonding defects, such as voids, in the bonding portion).

Throughout the specification, the expression "surface roughness" means an arithmetic surface roughness Ra calculated on the basis of JIS B0601 (2001), and, the expression "average primary particle diameter ($D_{50}$ diameter) of silver particles" means the 50% particle diameter ($D_{50}$ diameter) of silver particles (the diameter of cumulative 50% by weight of silver particles) measured by the laser diffractometry, the expression "average primary particle diameter of fine silver particles" meaning an average value of primary particle diameters of fine silver particles obtained from an image of a transmission electron microscope (TEM image).

Examples of an electronic part mounting substrate and a method for producing the same according to the present invention will be described below in detail.

EXAMPLE 1

First, a ceramic substrate of AlN having a size of 78 mm×95 mm×0.6 mm was arranged in a mold, and a molten metal of aluminum having a purity of 99.9% by weight was injected into the mold so as to contact both major surfaces of the ceramic substrate. Then, the molten metal was cooled and solidified to form a metal plate (for mounting thereon electronic parts) having a size of 68 mm×85 mm×0.2 mm and a metal base plate (for heat radiation) having a size of 68 mm×85 mm×0.2 mm on the major surfaces, respectively, to bond them directly to the major surfaces of the ceramic substrate, respectively.

Then, the surface treatment of the metal plate (for mounting thereon electronic parts) was carried out by a wet blasting apparatus (Model No. NFR-737 commercially available from MACOHO Co., Ltd.). As treatment conditions in the wet blasting apparatus, the air pressure was 0.2 MPa, and the throughput speed was 0.3 m/min. In addition, the distance of projection was 20 mm, and the angle of projection was 90°. Moreover, there was used an abrasive slurry containing 15% by volume of alumina #320 having an average particle diameter of 40 μm as abrasive grains in water. With respect to the metal plate (for mounting thereon electronic parts) treated by the blasting, the line roughness along an optional straight line having a length of 100 μm parallel to one side of an optional square area having a size of 100 μm×100 μm on the surface of the metal plate was measured by means of the line roughness measuring function of a super-depth surface profile measuring microscope (or color laser microscope) (VK-8500 commercially available from Keyence Corporation). From the measured line roughness, the surface roughness (arithmetic surface roughness Ra) was calculated on the basis of JIS B0601 (2001). As a result, the surface roughness was 1.19 μm.

Then, an Ni—P electroless plating film having a thickness of 5 μm was formed on the surface of the metal plate (for mounting thereon electronic parts) by dipping the metal plate in an electroless nickel plating solution (NIMUDEN SX commercially available from Uyemura Co., Ltd.) after the metal plate was pre-treated by double zincate conversion processes for carrying out zincate conversion twice. The surface roughness of the plating film thus formed was measured by the same method as that described above. As a result, the surface roughness thereof was 1.00 μm.

Then, after a silver paste (PA-HT-1001L commercially available from Dowa Electronics Materials Co., Ltd.) containing fine silver particles and silver particles dispersed in a dispersing medium was applied on an electronic part mounting portion of the plating film on the surface of the metal plate (for mounting thereon electronic parts), an Si chip (having a size of 13 mm×13 mm), the bottom face (reverse face) of which was plated with gold, was arranged on the silver paste on the electronic part mounting portion. Then, after the Si chip arranged on the metal plate via the silver paste was pre-heated at 100° C. for 10 minutes, it was heated at 260° C. for 2 minutes while being pressurized at 7 MPa via an Si rubber sheet. Thus, the Si chip was bonded to the metal plate (for mounting thereon electronic parts).

With respect to an electronic part mounting substrate thus produced, the bonded portion of the Si chip to the metal plate (for mounting thereon electronic parts) was observed by ultrasonic test equipment (Scanning Acoustic Tomograph (SAT)) (FS100II commercially available from Hitachi Construction Machinery Finetec Co., Ltd.). As a result, no peeling was observed in the bonded portion.

EXAMPLE 2

By the same method as that in Example 1 except that a molten metal of aluminum having a purity of 99.99% by weight was substituted for the molten metal of aluminum the purity of 99.9% by weight, an electronic part mounting part was produced to calculate the surface roughness of each of the metal plate and plating film thereof, and the bonded portion thereof was observed. As a result, the surface roughness of the metal plate was 1.36 m, the surface roughness of the plating film was 1.17 μm, and no peeling was observed in the bonded portion.

EXAMPLE 3

By the same method as that in Example 1 except that a molten metal of an Al—Si—B alloy containing 0.4% by weight of Si and 0.04% by weight of B was substituted for the molten metal of aluminum the purity of 99.9% by weight, an electronic part mounting part was produced to calculate the surface roughness of each of the metal plate and plating film thereof, and the bonded portion thereof was observed. As a result, the surface roughness of the metal plate was 1.39 μm, the surface roughness of the plating film was 1.38 μm, and no peeling was observed in the bonded portion.

EXAMPLE 4

By the same method as that in Example 2 except that the Ni—P electroless plating and pretreatment thereof were not carried out, an electronic part mounting part was produced to calculate the surface roughness of the metal plate thereof, and the bonded portion thereof was observed. As a result, the surface roughness of the metal plate was 1.36 µm, and no peeling was observed in the bonded portion.

EXAMPLE 5

By the same method as that in Example 2 except that a lapping machining was substituted for the wet blasting as the surface treatment, an electronic part mounting part was produced to calculate the surface roughness of each of the metal plate and plating film thereof, and the bonded portion thereof was observed. Furthermore, a single-side lapping machine (produced by SpeedFam Corporation) was used for carrying out the lapping machining at a machining pressure of 0.1 kg/cm$^2$ using a lapping agent containing alumina #600 having an average particle diameter of 20 µm as abrasive grains. As a result, the surface roughness of the metal plate was 0.30 µm, the surface roughness of the plating film was 0.71 µm, and no peeling was observed in the bonded portion.

EXAMPLE 6

By the same method as that in Example 5 except that a molten metal of an Al—Si—B alloy containing 0.4% by weight of Si and 0.04% by weight of B was substituted for the molten metal of aluminum the purity of 99.99% by weight, an electronic part mounting part was produced to calculate the surface roughness of each of the metal plate and plating film thereof, and the bonded portion thereof was observed. As a result, the surface roughness of the metal plate was 0.30 µm, the surface roughness of the plating film was 0.54 µm, and no peeling was observed in the bonded portion.

COMPARATIVE EXAMPLE 1

By the same method as that in Example 1 except that a grinding machine (DAS8920 commercially available from Disco Inc.) was used for carrying out grinding in place of the wet blasting as the surface treatment, an electronic part mounting part was produced to calculate the surface roughness of each of the metal plate and plating film thereof, and the bonded portion thereof was observed. As a result, the surface roughness of the metal plate was 0.02 µm, and the surface roughness of the plating film was 0.24 µm. The Si chip was peeled from the metal plate (for mounting thereon electronic parts) in the bonded portion thereof.

COMPARATIVE EXAMPLE 2

By the same method as that in Comparative Example 1 except that a molten metal of aluminum having a purity of 99.99% by weight was substituted for the molten metal of aluminum the purity of 99.9% by weight and that the Ni—P electroless plating and pretreatment thereof were not carried out, an electronic part mounting part was produced to calculate the surface roughness of the metal plate thereof, and the bonded portion thereof was observed. As a result, the surface roughness of the metal plate was 0.02 µm, and the Si chip was peeled from the metal plate (for mounting thereon electronic parts) in the bonded portion thereof.

COMPARATIVE EXAMPLE 3

By the same method as that in Example 1 except that polishing was substituted for the wet blasting as the surface treatment, an electronic part mounting part was produced to calculate the surface roughness of each of the metal plate and plating film thereof, and the bonded portion thereof was observed. Furthermore, a single-side polishing machine (produced by SpeedFam Corporation) was used for carrying out polishing at a machining pressure of 0.1 kg/cm$^2$ using a polishing agent containing alumina #600 having an average particle diameter of 20 µm as abrasive grains. As a result, the surface roughness of the metal plate was 0.07 µm, and the surface roughness of the plating film was 0.13 µm. The Si chip was peeled from the metal plate (for mounting thereon electronic parts) in the bonded portion thereof.

COMPARATIVE EXAMPLE 4

By the same method as that in Comparative Example 3 except that a molten metal of aluminum having a purity of 99.99% by weight was substituted for the molten metal of aluminum the purity of 99.9% by weight, an electronic part mounting part was produced to calculate the surface roughness of each of the metal plate and plating film thereof, and the bonded portion thereof was observed. As a result, the surface roughness of the metal plate was 0.07 µm, and the surface roughness of the plating film was 0.12 µm. The Si chip was peeled from the metal plate (for mounting thereon electronic parts) in the bonded portion.

COMPARATIVE EXAMPLE 5

By the same method as that in Comparative Example 3 except that a molten metal of an Al—Si—B alloy containing 0.4% by weight of Si and 0.04% by weight of B was substituted for the molten metal of aluminum the purity of 99.9% by weight, an electronic part mounting part was produced to calculate the surface roughness of each of the metal plate and plating film thereof, and the bonded portion thereof was observed. As a result, the surface roughness of the metal plate was 0.07 µm, and the surface roughness of the plating film was 0.16 µm. The Si chip was peeled from the metal plate (for mounting thereon electronic parts) in the bonded portion.

COMPARATIVE EXAMPLE 6

By the same method as that in Comparative Example 4 except that the Ni—P electroless plating and pretreatment thereof were not carried out, an electronic part mounting part was produced to calculate the surface roughness of the metal plate thereof, and the bonded portion thereof was observed. As a result, the surface roughness of the metal plate was 0.07 µm, and the Si chip was peeled from the metal plate (for mounting thereon electronic parts) in the bonded portion.

EXAMPLE 7

By the same method as that in Example 1 except that the Ni—P electroless plating and pretreatment thereof were not carried out and that the pressure was 15 MPa when the Si chip was bonded to the metal plate, an electronic part mounting part was produced to calculate the surface roughness of the metal plate thereof, and the bonded portion thereof was observed. As a result, the surface roughness of the metal plate was 1.4 µm, and no peeling was observed in the bonded portion. Furthermore, the Vickers hardness Hv of the metal plate was 29.1.

EXAMPLE 8

By the same method as that in Example 7 except that the pressure was 7 MPa when the Si chip was bonded to the metal plate and that the bonding of the Si chip to the metal plate was carried out in an atmosphere of nitrogen, an electronic part mounting part was produced to calculate the surface roughness of the metal plate thereof, and the bonded portion thereof was observed. As a result, the surface roughness of the metal plate was 1.4 µm, and no peeling was observed in the bonded portion. Furthermore, the Vickers hardness Hv of the metal plate was 29.1.

EXAMPLE 9

By the same method as that in Example 1 except that the Ni—P electroless plating and pretreatment thereof were not carried out, that the surface of the metal plate was pickled with sulfuric acid as the pretreatment of the metal plate bonded to the ceramic substrate and that the bonding of the Si chip to the metal plate was carried out in an atmosphere of nitrogen, an electronic part mounting part was produced to calculate the surface roughness of the metal plate thereof, and the bonded portion thereof was observed. As a result, the surface roughness of the metal plate was 1.4 µm, and no peeling was observed in the bonded portion. Furthermore, the Vickers hardness Hv of the metal plate was 29.1.

EXAMPLE 10

By the same method as that in Example 1 except that the Ni—P electroless plating and pretreatment thereof were not carried out, that the surface of the metal plate was pickled with hydrofluoric acid as the pretreatment of the metal plate bonded to the ceramic substrate and that the bonding of the Si chip to the metal plate was carried out in an atmosphere of nitrogen, an electronic part mounting part was produced to calculate the surface roughness of the metal plate thereof, and the bonded portion thereof was observed. As a result, the surface roughness of the metal plate was 1.4 µm, and no peeling was observed in the bonded portion. Furthermore, the Vickers hardness Hv of the metal plate was 29.1.

EXAMPLE 11

By the same method as that in Example 1 except that the Ni—P electroless plating and pretreatment thereof were not carried out and that a silver paste (PA-HT-1503M-C commercially available from Dowa Electronics Materials Co., Ltd.) containing fine silver particles in a dispersing medium was used, an electronic part mounting part was produced to calculate the surface roughness of the metal plate thereof, and the bonded portion thereof was observed. As a result, the surface roughness of the metal plate was 1.4 µm, and no peeling was observed in the bonded portion. Furthermore, the Vickers hardness Hv of the metal plate was 29.1.

EXAMPLE 12

By the same method as that in Example 2 except that the Ni—P electroless plating and pretreatment thereof were not carried out, an electronic part mounting part was produced to calculate the surface roughness of the metal plate thereof, and the bonded portion thereof was observed. As a result, the surface roughness of the metal plate was 1.4 µm, and no peeling was observed in the bonded portion. Furthermore, the Vickers hardness Hv of the metal plate was 23.2.

EXAMPLE 13

By the same method as that in Example 5 except that the Ni—P electroless plating and pretreatment thereof were not carried out, an electronic part mounting part was produced to calculate the surface roughness of the metal plate thereof, and the bonded portion thereof was observed. As a result, the surface roughness of the metal plate was 0.3 µm, and no peeling was observed in the bonded portion. Furthermore, the Vickers hardness Hv of the metal plate was 23.2.

EXAMPLE 14

By the same method as that in Example 5, an electronic part mounting part was produced to calculate the surface roughness of each of the metal plate and plating film thereof, and the bonded portion thereof was observed. As a result, the surface roughness of the metal plate was 0.3 µm, the surface roughness of the plating film was 0.7 µm and no peeling was observed in the bonded portion. Furthermore, the Vickers hardness Hv of the metal plate was 23.2.

EXAMPLE 15

By the same method as that in Example 12 except that the pressure was 5 MPa when the Si chip was bonded to the metal plate, an electronic part mounting part was produced to calculate the surface roughness of the metal plate thereof, and the bonded portion thereof was observed. As a result, the surface roughness of the metal plate was 1.4 µm, and no peeling was observed in the bonded portion. Furthermore, the Vickers hardness Hv of the metal plate was 23.2.

EXAMPLE 16

By the same method as that in Example 7 except that the pressure was 5 MPa when the Si chip was bonded to the metal plate, an electronic part mounting part was produced to calculate the surface roughness of the metal plate thereof, and the bonded portion thereof was observed. As a result, the surface roughness of the metal plate was 1.4 µm, and no peeling was observed in the bonded portion. Furthermore, the Vickers hardness Hv of the metal plate was 29.1.

EXAMPLE 17

By the same method as that in Example 3 except that the Ni—P electroless plating and pretreatment thereof were not carried out and that the pressure was 5 MPa when the Si chip was bonded to the metal plate, an electronic part mounting part was produced to calculate the surface roughness of the metal plate thereof, and the bonded portion thereof was observed. As a result, the surface roughness of the metal plate was 1.4 µm, and no peeling was observed in the bonded portion. Furthermore, the Vickers hardness Hv of the metal plate was 38.0.

Table 1 shows the producing conditions for the electronic part mounting substrate in these examples and comparative examples. In Table 1, ST denotes surface treatment, WB denoting wet blasting, LAP denoting lapping machining, GRI denoting grinding, POL denoting polishing, and DZ denoting double zincate.

TABLE 1

|  | Material | ST | Ra (μm) | Hv | Plating | Pre-Treatment | Atmosphere | Pressure (MPa) |
|---|---|---|---|---|---|---|---|---|
| Ex. 1 | Al (3N) | WB | 1.19 | — | Ni—P | DZ | air | 7 |
| Ex. 2 | Al (4N) | WB | 1.36 | — | Ni—P | DZ | air | 7 |
| Ex. 3 | Al—Si—B | WB | 1.39 | — | Ni—P | DZ | air | 7 |
| Ex. 4 | Al (4N) | WB | 1.36 | — | none | none | air | 7 |
| Ex. 5 | Al (4N) | LAP | 0.30 | — | Ni—P | DZ | air | 7 |
| Ex. 6 | Al—Si—B | LAP | 0.30 | — | Ni—P | DZ | air | 7 |
| Comp. 1 | Al (3N) | GRI | 0.02 | — | Ni—P | DZ | air | 7 |
| Comp. 2 | Al (4N) | GRI | 0.02 | — | none | none | air | 7 |
| Comp. 3 | Al (3N) | POL | 0.07 | — | Ni—P | DZ | air | 7 |
| Comp. 4 | Al (4N) | POL | 0.07 | — | Ni—P | DZ | air | 7 |
| Comp. 5 | Al—Si—B | POL | 0.07 | — | Ni—P | DZ | air | 7 |
| Comp. 6 | Al (4N) | POL | 0.07 | — | none | none | air | 7 |
| Ex. 7 | Al (3N) | WB | 1.4 | 29.1 | none | none | air | 15 |
| Ex. 8 | Al (3N) | WB | 1.4 | 29.1 | none | none | $N_2$ | 7 |
| Ex. 9 | Al (3N) | WB | 1.4 | 29.1 | none | $H_2SO_4$ | $N_2$ | 7 |
| Ex. 10 | Al (3N) | WB | 1.4 | 29.1 | none | HF | $N_2$ | 7 |
| Ex. 11 | Al (3N) | WB | 1.4 | 29.1 | none | none | air | 7 |
| Ex. 12 | Al (4N) | WB | 1.4 | 23.2 | none | none | air | 7 |
| Ex. 13 | Al (4N) | LAP | 0.3 | 23.2 | none | none | air | 7 |
| Ex. 14 | Al (4N) | LAP | 0.3 | 23.2 | Ni—P | DZ | air | 7 |
| Ex. 15 | Al (4N) | WB | 1.4 | 23.2 | none | none | air | 5 |
| Ex. 16 | Al (3N) | WB | 1.4 | 29.1 | none | none | air | 5 |
| Ex. 17 | Al—Si—B | WB | 1.4 | 38 | none | none | air | 5 |

With respect to each of the electronic part mounting substrates produced in Examples 7 through 17, after a heat cycle (in one cycle, after the substrate was held at −40° C. for 15 minutes, it was held at room temperature for 1 minute, and then, it was held at 250° C. for 5 minutes) was repeatedly carried out one hundred times, three hundred times, five hundred time, eight hundred times and one thousand times, respectively, the bonded state thereof was observed. As a result, although the Si chip was satisfactorily bonded to the metal plate (for mounting thereon electronic parts) of the electronic part mounting substrates produced in Examples 7 through 15, the Si chip was peeled from the metal plate (for mounting thereon electronic parts) in the bonded portion of the electronic part mounting substrates produced in Examples 16 and 17. From these results, it can be seen that it is possible to obtain a sufficient bonding strength even after the above-described heat cycles if the pressure is not less than 5 MPa when an Si chip is bonded to a metal plate (for mounting thereon electronic parts) having a relatively low Vickers hardness Hv, such as a metal plate of aluminum having a purity of 99.99% by weight, whereas it is not possible to obtain a sufficient bonding strength after the above-described heat cycles if the pressure is 5 MPa when an Si chip is bonded to a metal plate (for mounting thereon electronic parts) having a relatively high Vickers hardness Hv, such as a metal plate of aluminum having a purity of 99.9% by weight or an Al—Si—B alloy. Therefore, in order to produce an electronic part mounting substrate having such an excellent heat resistance that can obtain a sufficient bonding strength even after the above-described heat cycles, an Si chip is preferably bonded to a metal plate (for mounting thereon electronic parts) having a relatively low Vickers hardness Hv, such as a metal plate of aluminum having a purity of 99.99% by weight. Alternatively, a higher pressure is preferably applied when an Si chip is bonded to a metal plate (for mounting thereon electronic parts) having a relatively high Vickers hardness Hv, such as a metal plate of aluminum having a purity of 99.9% by weight or an Al—Si—B alloy.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A method for producing an electronic part mounting substrate, the method comprising the steps of:
   surface-machining one side of the metal plate of aluminum or the aluminum alloy by wet blasting or lapping so as to cause the surface roughness thereof to be 0.3 to 1.4 micrometers, wherein the wet blasting or lapping uses abrasive grains having average particle diameter of at least 20 micrometers;
   applying the silver paste on the surface-machined side of the metal plate of aluminum or the aluminum alloy;
   arranging an electronic part on the silver paste applied on the surface-machined side of the metal plate of aluminum or the aluminum alloy; and
   heating the silver paste, on which the electronic part is arranged and which is applied on the surface-machined side of the metal plate of aluminum or the aluminum alloy, at a temperature of 220 to 300° C. while pressing the electronic part at a pressure of 3 to 8 MPa against the metal plate, to sinter silver in the silver paste to form a silver bonding layer between the electronic part and the surface-machined side of the metal plate of aluminum or the aluminum alloy to bond the electronic part to the surface-machined side of the metal plate of aluminum or the aluminum alloy with the silver bonding layer.

2. A method for producing an electronic part mounting substrate, the method comprising the steps of:
   surface-machining one side of the metal plate of aluminum or the aluminum alloy by wet blasting or lapping so as to cause the surface roughness thereof to be 0.3 to 1.4 micrometers, wherein the wet blasting or lapping uses abrasive grains having average particle diameter of at least 20 micrometers;

plating the surface-machined side of the metal plate of aluminum or the aluminum alloy with the nickel or a nickel alloy to form a plating film having a surface roughness of 0.5 to 2.0 micrometers;

applying the silver paste on the plating film formed on the surface-machined side of the metal plate of aluminum or the aluminum alloy;

arranging the electronic part on the silver paste applied on the plating film formed on the surface-machined side of the metal plate of aluminum or the aluminum alloy; and heating the sliver paste, on which the electronic part is arranged and which is applied on the plating film formed on the surface-machined side of the metal plate of aluminum or the aluminum alloy, at a temperature of 220 to 300° C. while pressing the electronic part at a pressure of 3 to 8 MPa against the plating film, to sinter silver in the silver paste to form a silver bonding layer between the electronic part and the plating film, which is formed on the surface-machined side of the metal plate of aluminum or the aluminum alloy, to bond the electronic part to the plating film, which is formed on the surface-machined side of the metal plate of aluminum or the aluminum alloy, with the silver bonding layer.

3. A method for producing an electronic part mounting substrate as set forth in claim 1, wherein a surface of said electronic part to be bonded to said surface-machined side of the metal plate is covered with a metal capable of being bonded with said silver paste.

4. A method for producing an electronic part mounting substrate as set forth in claim 3, wherein said metal capable of being bonded with said silver paste is at least one metal, which is selected from the group consisting of gold, silver, copper and palladium, or an alloy thereof.

5. A method for producing an electronic part mounting substrate as set forth in claim 1, wherein a surface of said electronic part to be bonded to said surface-machined side of the metal plate is plated with at least one metal, which is selected from the group consisting of gold, silver and palladium, or an alloy thereof.

6. A method for producing an electronic part mounting substrate as set forth in claim 1, wherein one side of a ceramic substrate is bonded to the other side of said metal plate.

7. A method for producing an electronic part mounting substrate as set forth in claim 6, wherein a metal base plate is bonded to the other side of said ceramic substrate.

8. A method for producing an electronic part mounting substrate as set forth in claim 2, wherein a surface of said electronic part to be bonded to said plating film is covered with a metal capable of being bonded with said silver paste.

9. A method for producing an electronic part mounting substrate as set forth in claim 8, wherein said metal capable of being bonded with said silver paste is at least one metal, which is selected from the group consisting of gold, silver, copper and palladium, or an alloy thereof.

10. A method for producing an electronic part mounting substrate as set forth in claim 2, wherein a surface of said electronic part to be bonded to said plating film is plated with at least one metal, which is selected from the group consisting of gold, silver and palladium, or an alloy thereof.

11. A method for producing an electronic part mounting substrate as set forth in claim 2, wherein one side of a ceramic substrate is bonded to the other side of said metal plate.

12. A method for producing an electronic part mounting substrate as set forth in claim 11, wherein a metal base plate is bonded to the other side of said ceramic substrate.

13. A method for producing an electronic part mounting substrate as set forth in claim 1, wherein said metal plate has a Vickers hardness Hv of 23.2 to 38.

* * * * *